United States Patent [19]

Selvakumar et al.

[11] Patent Number: 5,426,069

[45] Date of Patent: Jun. 20, 1995

[54] METHOD FOR MAKING SILICON-GERMANIUM DEVICES USING GERMANIUM IMPLANTATION

[75] Inventors: Chettypalayam R. Selvakumar; Savvas G. Chamberlain, both of Waterloo, Canada

[73] Assignee: Dalsa Inc., Waterloo, Canada

[21] Appl. No.: 865,859

[22] Filed: Apr. 9, 1992

[51] Int. Cl.⁶ .................................. H01L 21/20
[52] U.S. Cl. ............................ 437/131; 437/24; 437/976; 257/286; 257/288
[58] Field of Search ................. 437/24, 976, 131, 149, 437/154; 257/286, 288, 616; 148/DIG. 82, DIG. 97

[56] References Cited

U.S. PATENT DOCUMENTS

| | | | |
|---|---|---|---|
| 4,137,103 | 1/1979 | Mader et al. | 437/976 |
| 4,601,760 | 7/1986 | Hemmah et al. | 437/31 |
| 4,810,665 | 3/1989 | Chang et al. | 437/149 |
| 4,835,112 | 5/1989 | Pfiester et al. | 437/24 |
| 4,837,173 | 6/1989 | Alvis et al. | 437/24 |
| 4,845,047 | 7/1989 | Holloway et al. | 437/45 |
| 5,091,328 | 2/1992 | Miller | 437/45 |
| 5,126,278 | 1/1992 | Kodaira | 437/24 |
| 5,238,864 | 8/1993 | Maegawa et al. | 437/154 |
| 5,296,386 | 3/1994 | Aronowitz et al. | 437/131 |
| 5,296,387 | 3/1994 | Aronowitz et al. | 437/131 |

FOREIGN PATENT DOCUMENTS

| | | | |
|---|---|---|---|
| 412002 | 6/1991 | European Pat. Off. | 437/24 |
| 220812 | 4/1985 | Japan | 437/24 |
| 220814 | 4/1985 | Japan | 437/24 |
| 194962 | 8/1991 | Japan . | |

OTHER PUBLICATIONS

Srivatsa et al. in "Nature of interfaces and oxidation processes in Ge+ implanted Silicon" in J. Appl. Phys. 65(10), 15 May 1989, pp. 4028–4035.

Wang et al. in "Fabrication and characterisation of Germanium Ion-Implanted IGFETs" IEEE Transactions of Electron Devices, Jun. 1975, pp. 353–354.

Nayak et al. in "Enhancement mode Quantum Well $Ge_xSi_{1-x}$ PMOS" in IEEE Electron Devices Letters vol. 12(4), Apr. 1991, pp. 154–156.

Primary Examiner—Nam Nguyen
Assistant Examiner—Ramamohau Rao Paladugu
Attorney, Agent, or Firm—R. Craig Armstrong

[57] ABSTRACT

Silicon-germanium devices including MOSFETs, photogates and photodiodes, are produced by implanting the Si or polycrystalline silicon substrate with Ge+, to realize active SiGe regions within Si which are substantially free from defects, at an appropriate point in the fabrication by conventional techniques.

11 Claims, 10 Drawing Sheets

METHOD FOR MAKING SILICON-GERMANIUM DEVICES USING GERMANIUM IMPLANTATION

BACKGROUND OF THE INVENTION

This invention relates to solid state silicon devices generally, and particularly to silicon-germanium devices, and methods of producing same.

Silicon-germanium (SiGe) devices are known in the prior art, but are generally produced through molecular beam epitaxy (MBE), chemical vapour deposition (CVD), or other relatively expensive and inefficient techniques, such as Ultra High Vacuum Chemical Vapour Deposition (UHV/CVD) or Rapid Thermal CVD (RTCVD). Such methods are difficult to integrate with existing fabrication lines.

The following references will be referred to later herein, by the reference number shown in square brackets:

[1] R. People, IEEE J. Quantum Electronics, Sept. 1986

[2] F. K. LeGoues, R. Rosenberg, and B. S. Meyerson, "Kinetics and mechanism of oxidation of SiGe: Dry versus wet oxidation," Appl. Phys. Lett., vol. 54, no. 7, pp. 644-646, Feb. 13, 1989.

[3] D. Nayak, K. Kamjoo, J.C.S. Woo, J. S. Park, and K. L. Wang, "Rapid thermal oxidation of GeSi strained layers," Appl. Phys. Lett., vol. 56, no. 1, pp. 66-68, Jan. 1, 1990.

[4] Brown R. W. and Chamberlain S. G. Phys. Stat. Sol. (a) 20, pp. 675-685, 1973.

[5] "CCD Image Sensors", DALSA INC. Data Book, 1989.

[6] Chamberlain S. G. and Washkurak W. D., Proceedings of the International Society for Optical Engineers, SPIE Vol. 1242, pp. 252-262, 1990.

[7] Chamberlain S. G. and Broughton J. H., Proceedings IEEE Custom Integrated Circuits Conference, pp. 138-143, 1985.

SUMMARY OF THE INVENTION

In the present invention, SiGe devices are achieved by implanting the Si or polycrystalline silicon substrate with Ge+, to realize active binary alloy SiGe regions within Si, at an appropriate point in the fabrication by conventional techniques. This enhances the performance of the devices or imparts a new capability, offering a significant improvement over prior art devices. Examples of such devices are SiGe/Si heterostructure diodes, SiGe base heterostructure bipolar transistors, SiGe channel MOSFETs (n-channel and p-channel), SiGe gate MOSFETs and CCD image sensors which can operate in the infra-red region, and other devices.

As a specific example, SiGe MOSFETs fabricated according to the invention show higher drain conductance in the triode region and higher transconductance overall compared to silicon channel MOSFETs. The threshold voltage of the SiGe MOSFET appears to be smaller and the carrier mobility in the channel appears to be higher.

A major advantage of the present method is that one can easily realize SiGe layers in a localized region. Several different alloy combinations can be realized on the same wafer with only a few masks. For example, with merely 4 masking steps it is possible to realize 15 different alloy combinations on the same wafer selectively. Since ion implantation is a well-adapted standard technique, the present method is fully compatible with the existing planar processing technology and offers some unique advantages as compared with other methods. Further, the gate of the SiGe MOSFET device can be used as a photodetector region for infra-red wavelengths. In turn this SiGe photodetector gate can be used in conjunction with conventional silicon CCD shift-registers, all integrated on the same silicon chip, to form CCD image sensor arrays which operate in the visible and infra-red region. We also used our present SiGe ion implantation solid phase epitaxy technique to form a SiGe n-p junction which in turn could act as a conventional photodiode but detect light not only in the visible region but also in the near infra-red range. Using photoresist or oxide or other masking material, a controlled amount of Ge can be introduced into silicon by ion implantation. The alloy composition within the silicon depends on the energy and dose of the implantation. The silicon target is kept at liquid nitrogen temperature to lower the amorphization threshold and prevent in situ annealing.

The technique of introducing a controlled amount of Ge within a "small region" helps to create a small SiGe alloy region of desirable quality. Experimentally we found that a "small region" is an area of 8 micrometer by 8 micrometer or less. It is at present not verified but hypothesized that the SiGe region being surrounded by silicon on most of the surfaces helps to create a crystalline $Si_{1-x}Ge_x$ region which is possibly strained. It is also possible that the SiGe is strained in a more complex manner than the usual biaxial compressions encountered in MBE or other methods such as UHV/CVD or RTCVD or LRP.

If only biaxial stress was present, the change in the valence band discontinuity $\Delta E_v$ of the $Si_{1-x}Ge_x$ alloy for the germanium fraction X would be roughly given by $\Delta E_v = 0.74 \times$ (see R. People [1]). The bandgap reduction is useful because it is possible to realize a photodetector for longer wavelengths than silicon devices can handle.

The SiGe alloy region realized by ion implantation in small areas of silicon is surrounded by silicon and the concentration of germanium varies within this region. Because the SiGe region is surrounded by silicon and because the concentrations of Ge probably vary gradually it appears that a nearly defect-free SiGe alloy region is created as a result of implantation and subsequent heat treatment. It is not ascertained whether the SiGe is strained or relaxed due to experimental difficulties of probing very small areas.

BRIEF DESCRIPTION OF THE DRAWINGS

The invention will now be described in detail, with reference to the accompanying drawings, in which.

DETAILED DESCRIPTION OF THE PREFERRED EMBODIMENTS

Illustrative devices and the preferred method of fabrication will now be described in detail. However, it should be clearly understood that the invention is defined by the accompanying claims, and is not limited to the specific embodiments described herein, the specific embodiments being examples only.

Figure 1:
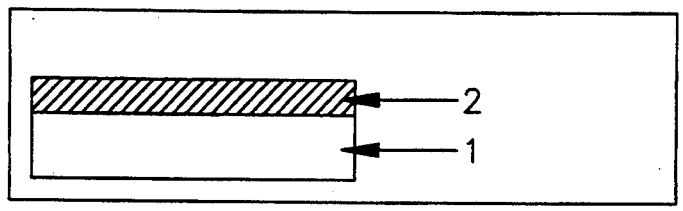
FIGS. 1-7 are cross-sectional drawings showing the sequence of steps in manufacturing an n-channel MOSFET according to the invention.
Figure 2:
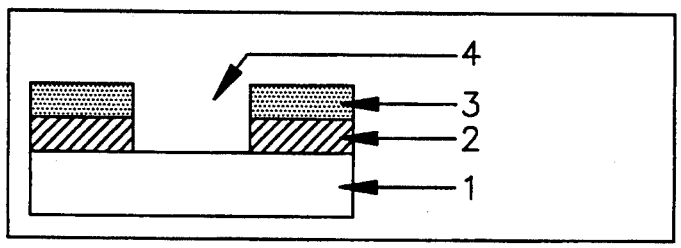
Figure 3:
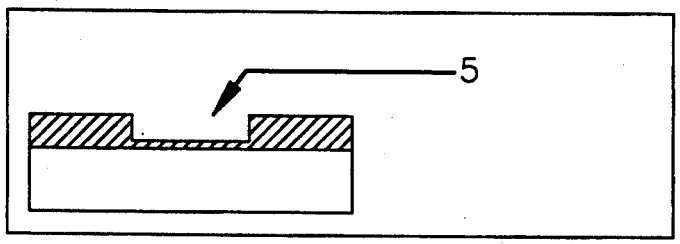
Figure 4:
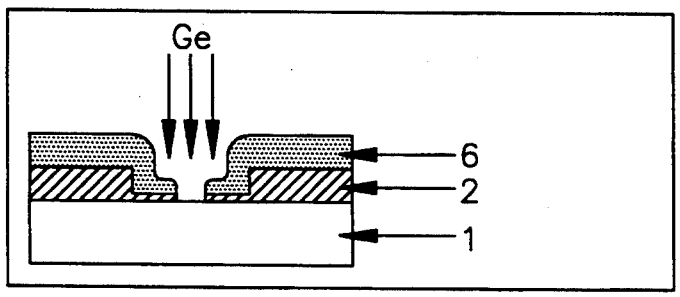
Figure 5:
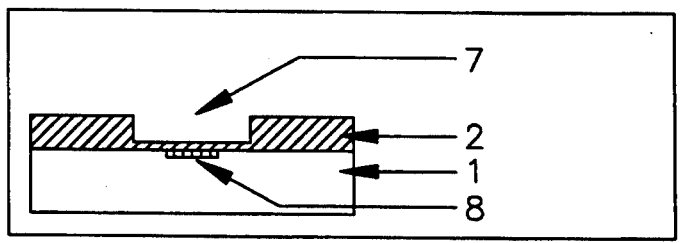
Figure 6:
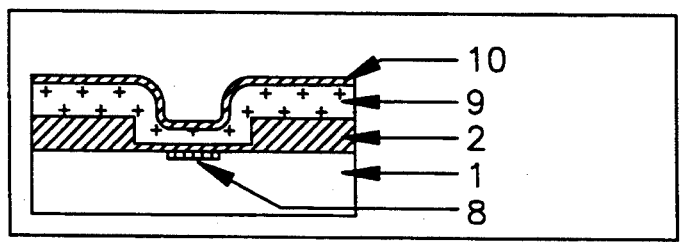
Figure 7:
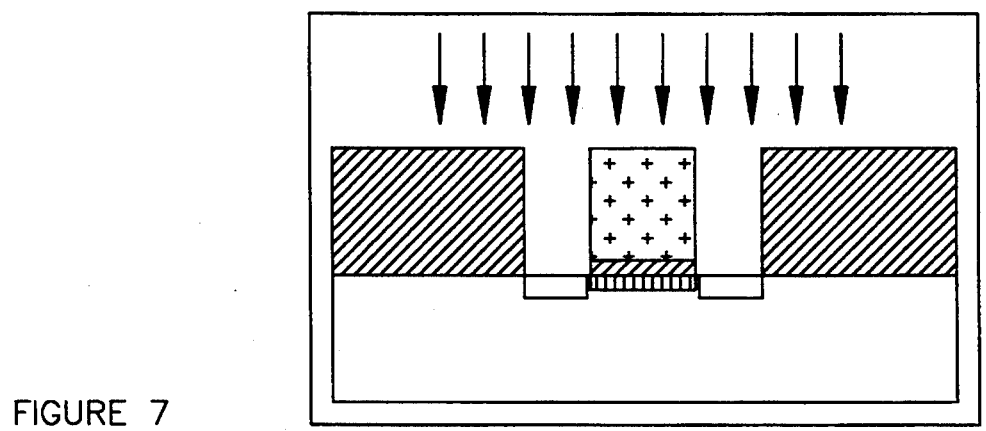

SiGe n-channel MOSFETs were fabricated according to the method of the invention, in varying sizes. The fabrication steps were as follows, for a self-aligned polysilicon gate n-MOSFET:

a. On a starting wafer 1 of p-type silicon (for example a 1-2 ohm-cm p-type silicon of <100> orientation), a thick field oxide layer 2 (approx. 7000 Angstroms) is grown (FIG. 1);

b. Using photoresist 3, the field oxide is etched in the device well 4 (FIG. 2);

c. The photoresist 3 is removed, and for the purpose of photoresist adhesion a very thin oxide layer 5 (approx. 100 Angstroms) is grown (FIG. 3);

d. Using photoresist 6 (1.8 μm), a window is etched for the channel region, and Ge is implanted (FIG. 4), for example Ge+ at an energy of 80 KeV and a dose of $6 \times 10^{16}$ cm$^{-2}$;

e. The photoresist 6 is removed, the area is deglazed, and a dry gate oxide layer 7 (approx. 1000 Angstroms) is grown over the Ge implant area 8 (FIG. 5);

f. Polysilicon 9 is deposited and oxidized, resulting in a poly oxide layer 10 (FIG. 6);

g. Using photoresist, the polysilicon and then the oxide are etched. Then source/drain forming dopant is diffused, to dope the poly gate (FIG. 7). If the poly gate needs to be doped differently, it can be done using an alternate scheme;

h. The source, drain and gate can be connected using metallization.

For the experimental MOSFETs fabricated in accordance with the above procedure, the peak atomic concentration of germanium in the channel is computed to be about 16%. Photoresist was used as a mask for the germanium implantation. The target was nominally kept at liquid nitrogen temperature (LN$_2$). Apart from this germanium implantation step all other pre- and post-processing steps were identical for the SiGe channel and silicon channel devices. Both the SiGe and Si channel devices were on the same chip adjacent to each other. The gate oxide was done at 1100° C. for 50 minutes in dry oxygen and a 20 minute nitrogen anneal was given. The gate oxide thickness was about 100 nm. Poly thickness was about 0.58 μm. Source and drain were realized by phosphorus diffusion using PH$_3$. It is expected that the SiGe channel device would have a gate oxide thickness that is close to the silicon channel device in view of the recent reports on dry oxidation by LeGoues et al [2] and by Nayak et al [3].

Figure 8:
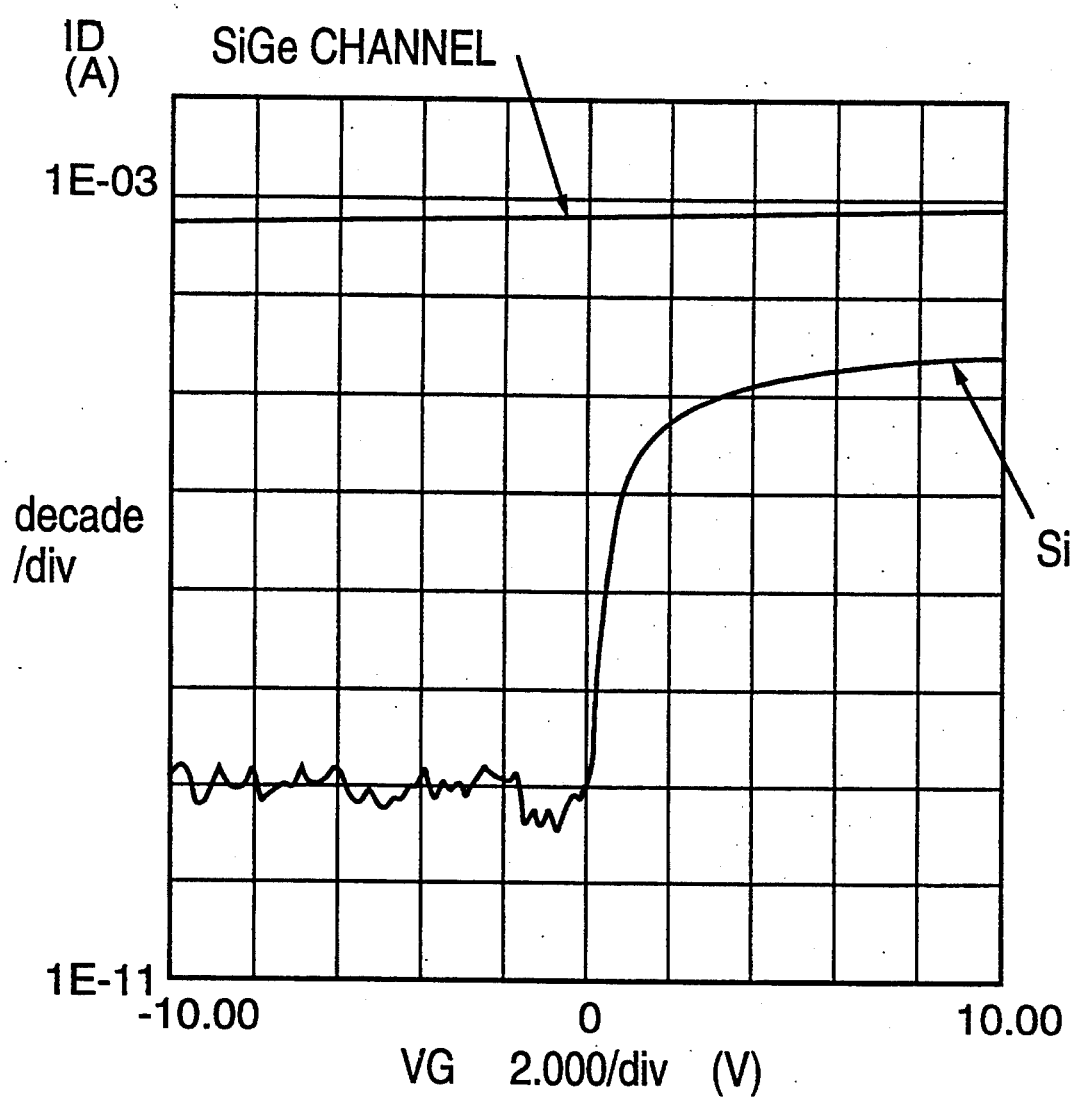
FIG. 8 is a plot of the subthreshold characteristics of a large area SiGe-channel and Si-channel MOSFETs showing that the SiGe-channel device does not turn off while the Si-channel device turns off.

MOSFETs of different channel region sizes were realized on the same chip. The channel region sizes were varied from 5 μm ×7 μm (W×L) to 30 μm×10 μm. The subthreshold characteristics of 5 μm×7 μm size devices showed that devices turned off quite acceptably, whereas the large area devices showed that the drain current did not decrease significantly at all (didn't turn off!) when gate voltage decreased. Thus indirectly it is evident that a small SiGe region surrounded by silicon gives rise to higher quality interface between silicon-dioxide and the SiGe channel region, whereas large area SiGe regions, either because of large misfit dislocations or other defects, give rise to poor quality interface, and the n-SiGe-channel is always on for large area devices for usual ranges of gate voltage (see FIG. 8).

Figure 9:
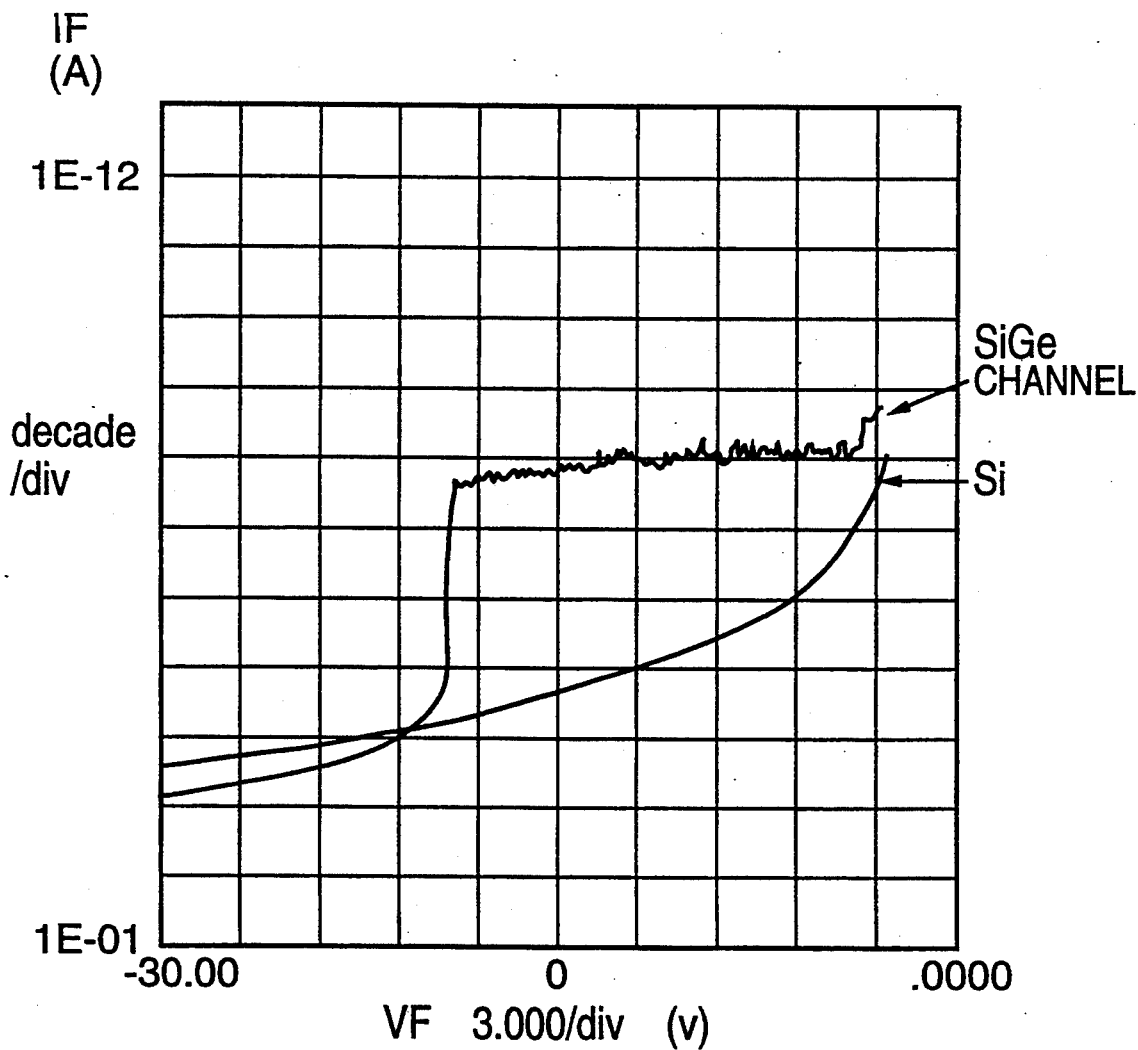
FIG. 9 is a plot of reverse bias characteristic of N+source-substrate diode.

It was also observed that the reverse leakage current of the source-substrate of the SiGe channel device was substantially smaller than for Si channel devices made on the same wafer. This is possibly indirect evidence for strain related gettering (see FIG. 9).

Figure 10:
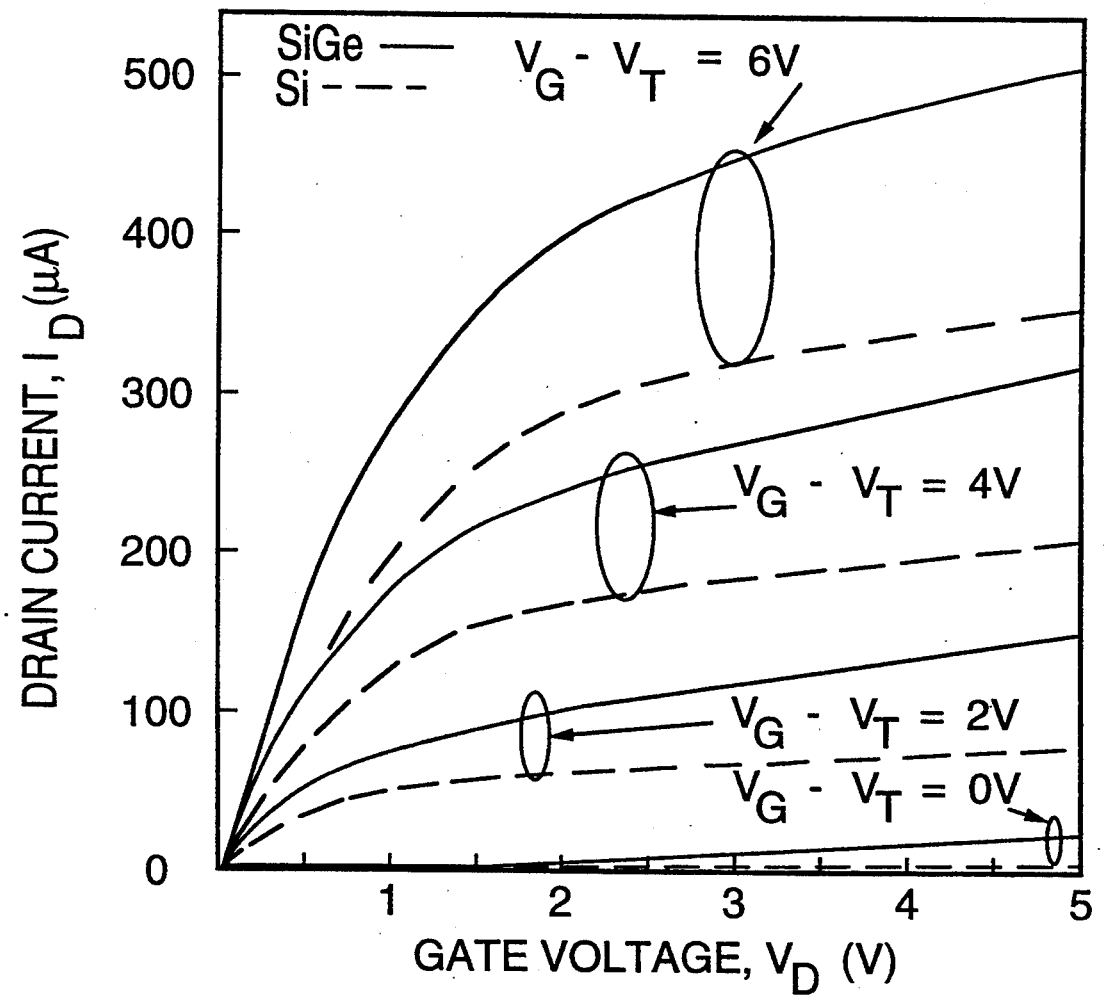
FIG. 10 is a comparison of the output characteristics of SiGe-channel and Si-channel transistors having identical mask dimensions.

FIG. 10 shows the output characteristics of SiGe channel n-MOSFET and the standard silicon channel n-MOSFET in the same chip having identical mask dimensions (Channel Length×Channel Width: 7 μm×5 μm.) As we can see from FIG. 10, the drain currents obtained for the SiGe channel MOSFET are substantially higher than those for Si channel MOSFET. It is also evident that the drain conductance in the triode region and the transconductance overall is better than in Si channel device.

Figure 11:
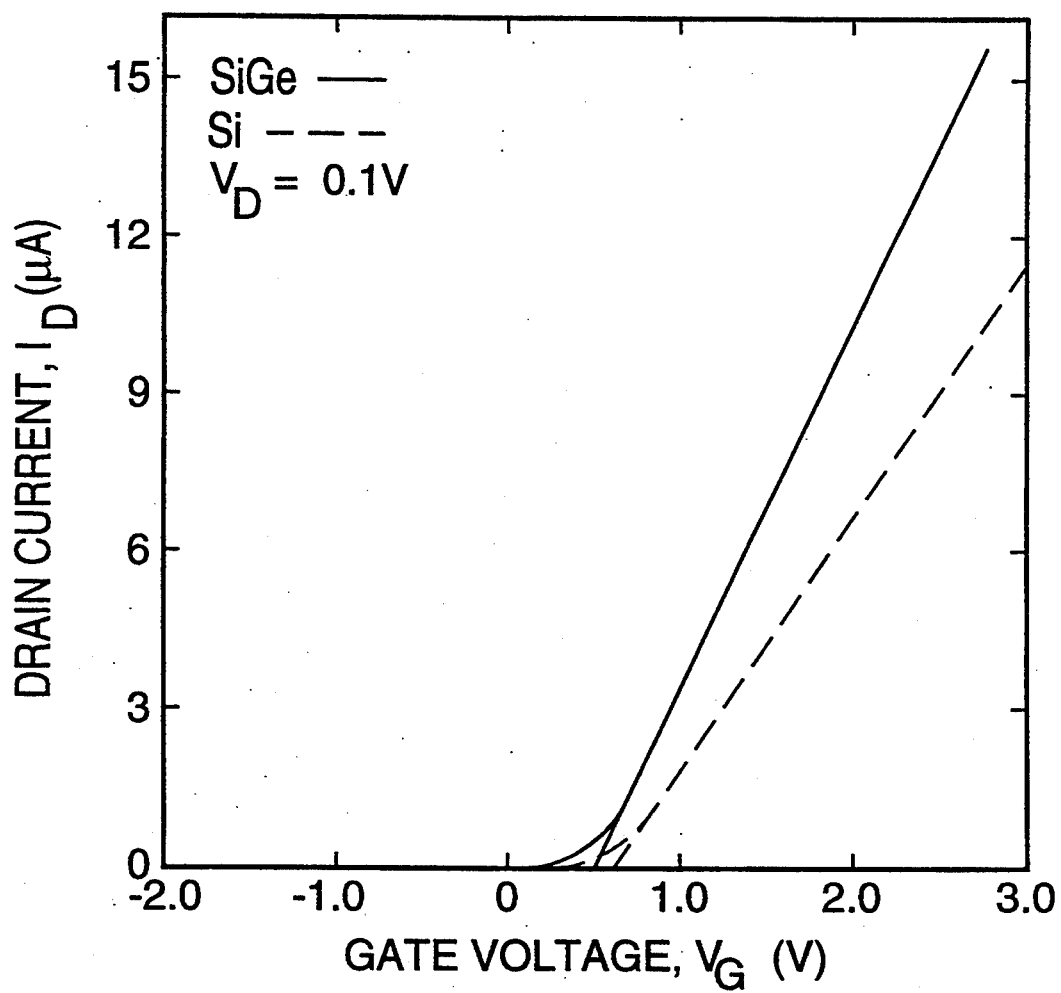
FIG. 11 is a plot of the Gate voltage versus Drain current characteristics of SiGe-channel and Si-channel MOSFETs.

FIG. 11 shows a plot of drain current ($I_D$) versus gate to source voltage ($V_G$) for very small drain voltage ($V_D=0.1$ Volt) for both SiGe channel and Si channel devices. The SiGe channel device shows a significantly smaller threshold voltage ($V_T$) compared with the Si channel device. For example the change in the threshold voltage ($\Delta V_t$) for the SiGe channel device compared with Si channel device was −0.127 Volt where $V_T(SiGe)=0.570$ Volt while $V_T(Si)=0.697$ Volt. More importantly from the slope of the $I_D$ versus $V_G$ curves seen in FIG. 11 we can infer that the $\beta=C_{ox}\mu_n W/L$ is significantly higher than that in Si channel device. It also appears possible that the surface mobility of the carriers ($\mu_n$) in the SiGe channel device might be significantly higher than that in Si channel device. Since we can write $$I_D \approx \frac{C_{ox}\mu_n W}{L} (V_G - V_T)V_D$$

for small $V_D$, we could infer from the slope of the $I_D$ versus $V_G$ characteristic that the SiGe channel device may have a higher surface electron mobility if we can assume that the effective channel length for both Si and SiGe devices are the same. From FIG. 11 one can see that the slope for the Si channel device is $5.16\times10^{-6}$ Amp/volt whereas the SiGe channel device shows a slope of $7.33\times10^{-6}$ Amp/volt. Thus assuming that the gate oxide thicknesses are same, the SiGe channel device seems to show a $\beta$ improvement of 42.0% over Si channel device (although not typical, a small number of devices do show $\beta$ improvement of 70% with excellent gate turn off characteristics). This improvement in $\beta$ could be due to a variety of reasons. Assuming that the thickness of the gate oxide is not less than that for Si channel device, the more than 40% $\beta$ enhancement could be in part due to an improvement in surface mobility which might be a result of the extremely abrupt interface at SiGe-channel/Silicon dioxide and in part due to a higher mobility in SiGe material or due to a shorter effective channel length. Most of the current predictions in bulk SiGe, either strained or otherwise, seem to indicate reduced majority carrier mobility in SiGe up to 85% of Ge content at least in the doping range employed in this work. However, it does not rule out the possibility of a higher carrier mobility for the inversion carriers in structures realized by ion-implantation.

Figure 12:
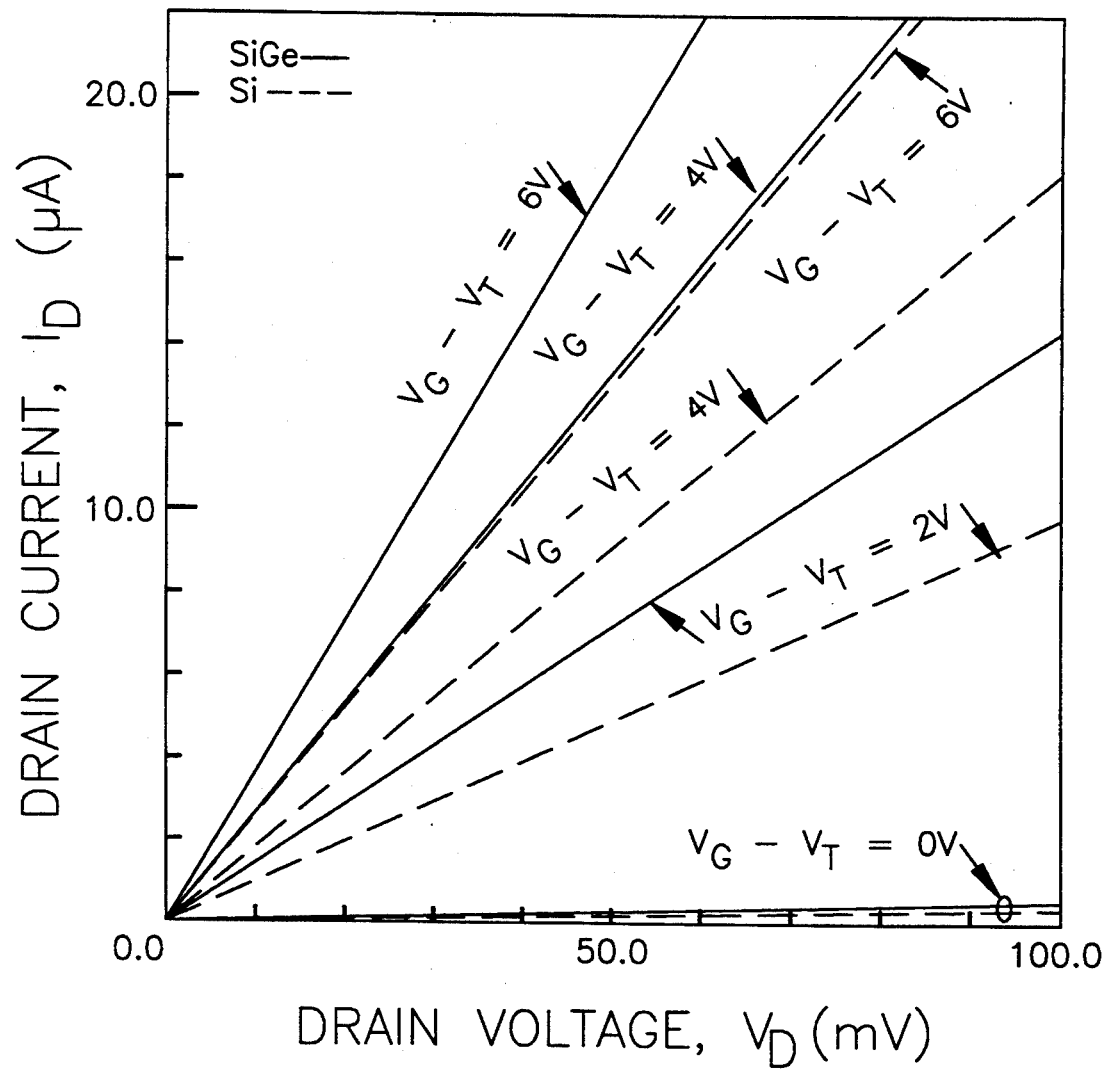
FIG. 12 is a plot of the triode region characteristics of SiGe-channel and Si-channel MOSFETs.
Figure 13:
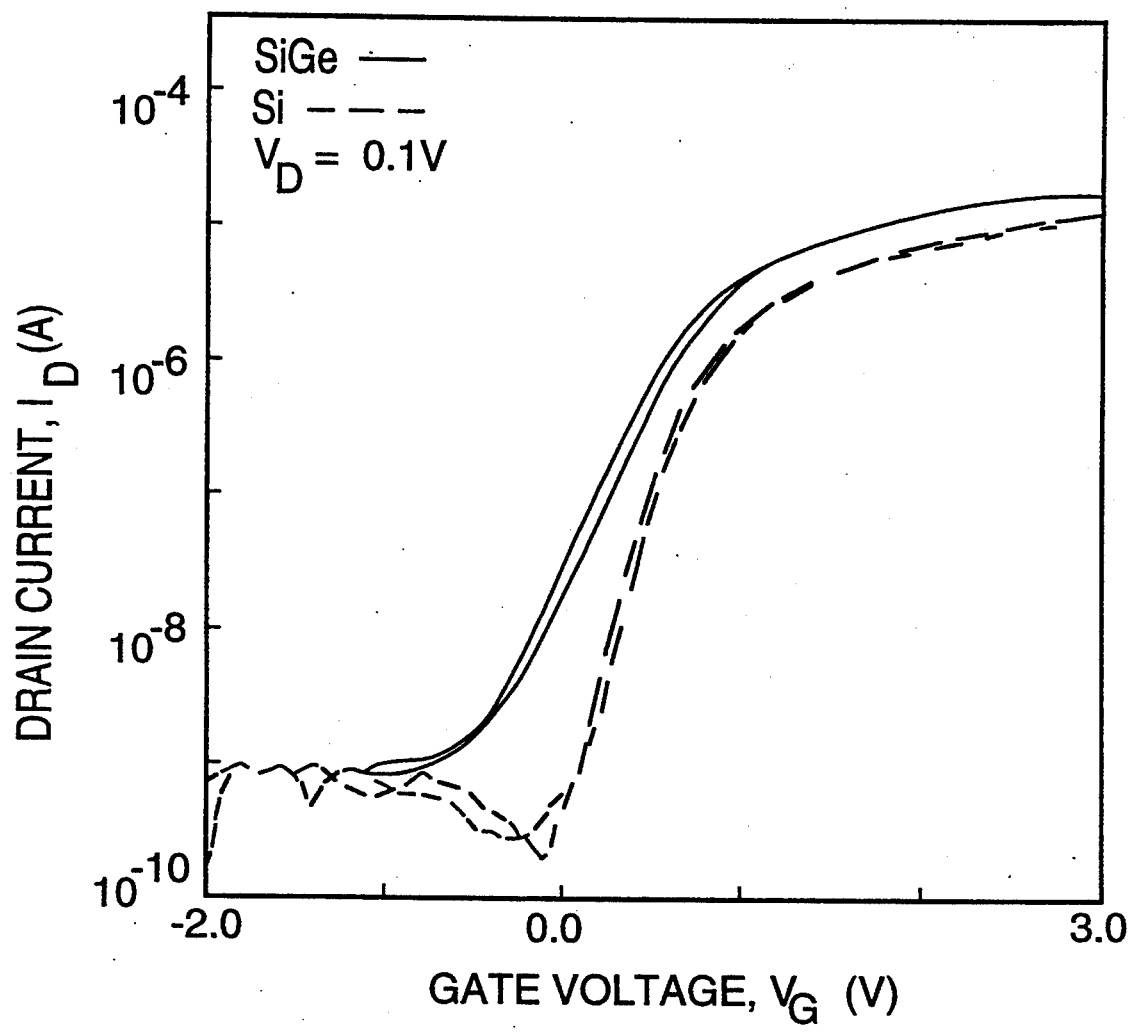
FIG. 13 is a comparison of subthreshold characteristics of small are SiGe-channel and Si-channel MOSFETs.

FIG. 12 shows the comparison of the SiGe channel devices characteristics in the triode region. The SiGe channel device shows a drain conductance improvement as high as 46% for some gate voltages even after cancelling out any dependence due to threshold voltage differences. On the whole higher drain currents and drain conductances are useful for realizing higher packing density. FIG. 13 shows subthreshhold current characteristics. A part of the slightly higher subthreshold current in the case of SiGe is due to smaller threshold voltage needed to form inversion layer and possibly a smaller source-channel barrier. The characteristics of the SiGe MOSFET are believed to be due to the less defective or nearly defect-free small SiGe regions surrounded by silicon all around. This hypothesis is very similar to the recent discoveries of much reduced misfit dislocation density observed in small area growths (terminated by oxide regions or mesa structures) in several semiconductor materials systems. However, the present hypothesis is distinctly different (because the SiGe is engulfed in a crystalline material) and is more interesting and more complex because of stresses acting in more than two axes.

Using the invention, devices can be fabricated which have regions containing several different alloy mixtures and varying physical extensions, using only a small number of masking steps as follows:
(i) a set of windows are opened through the masking layer using a first mask; these windows were kept as "small regions". "Small regions" we determined experimentally that need to be 8 micrometer in length or less, with a width of 8 micrometer or less.
(ii) Germanium ions are implanted (denoted as Implantation Cluster $I_1$) using a single or multiple steps to get an alloy mix which might vary in general as a function $g_1 (x,y,z)$ where $g_1$ is the germanium fraction and how it varies in the three dimensions x, y and z;
(iii) A masking layer is created after Implantation Cluster $I_1$ using a low temperature process so that the solid-phase epitaxy does not take place;
(iv) A second set of windows are then opened using a lithography and etching process and using a second mask. The second mask may have some overlapping regions with the first mask;
(v) Germanium implantations (denoted by $I_2$) are carried out through the windows created by the second mask.

As a result of implantation $I_2$, there would be some regions which received only implantations $I_1$, some regions which received only implantations $I_2$ and some regions which received both implantations $I_1$ and $I_2$. Continuing this process with more masks, many more distinctly different alloy combinations and depth distributions may be created. For example, with only four masks it is possible to create 15 different regions containing different alloy mixes and depth distributions on the same wafer.

To summarize, the first SiGe n-MOSFETs using germanium implantation and solid phase epitaxy have been fabricated. The SiGe MOSFETs show significantly higher performance than Si channel MOSFETs. Higher transconductance overall and higher drain conductance in the triode region have been observed. Higher surface channel mobility seems to be possible with the SiGe channel device. Being a conventional process, ion implantation appears to be a new and attractive way to realize heterostructure field effect devices.

SiGe/Si heterostructure diodes fabricated show a larger breakdown voltage than silicon devices made on the same wafer. The leakage current is also substantially smaller. The SiGe region was created using Ge implantation.

Polycrystalline SiGe created by Ge implantation was used as the gate of a MOSFET and compared with Si gate devices made on the same wafer. It was found that the threshold voltage was significantly affected (increased) and in smaller devices a significant increase in device transconductance was observed.

Applications

Figure 14:
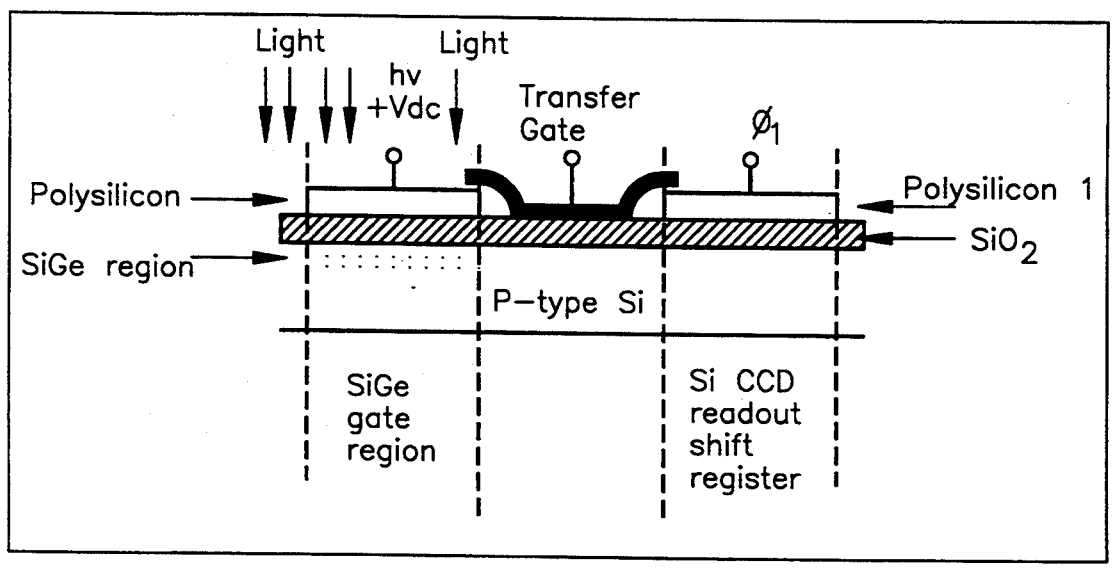
FIG. 14 shows an array of SiGe photogates collecting visible and new infra-red radiation and storing this under the SiGe photogate.

A SiGe photogate can be realized by using a polysilicon gate, a thin layer of $SiO_2$ on a p-type silicon substrate. A cross-section of this is shown in FIG. 14. The region under the polysilicon gate can be ion-implanted with Ge, in a similar fashion as the SiGe-MOSFET designed earlier to form a SiGe region near the silicon surface.

This SiGe gate can act as a photogate similar to a conventional CCD photogate (see Brown and Chamberlain [4]). The distinct difference is that this photogate will detect not only visible light but also detect infra red radiation.

Figure 15:
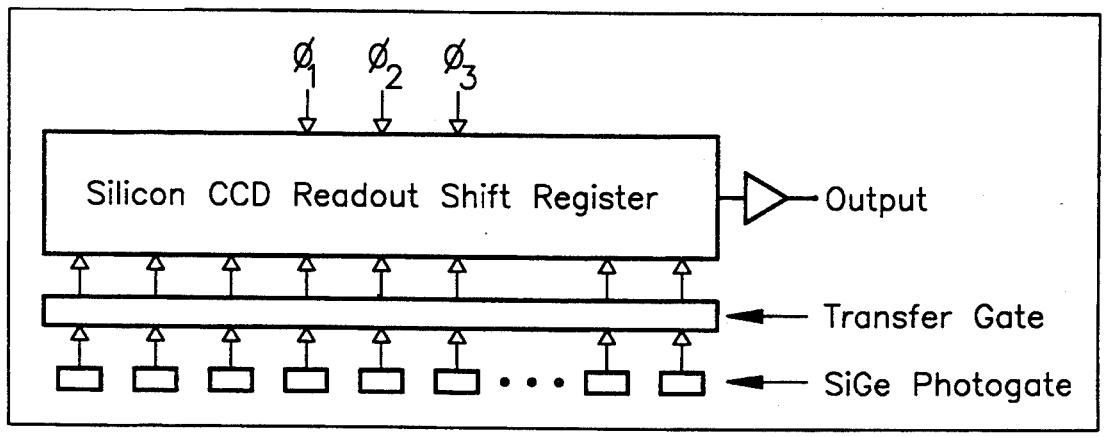
FIG. 15 shows a SiGe photogate used to realize a CCD linear image sensor array for visible and infra-red detection.
Figure 16:
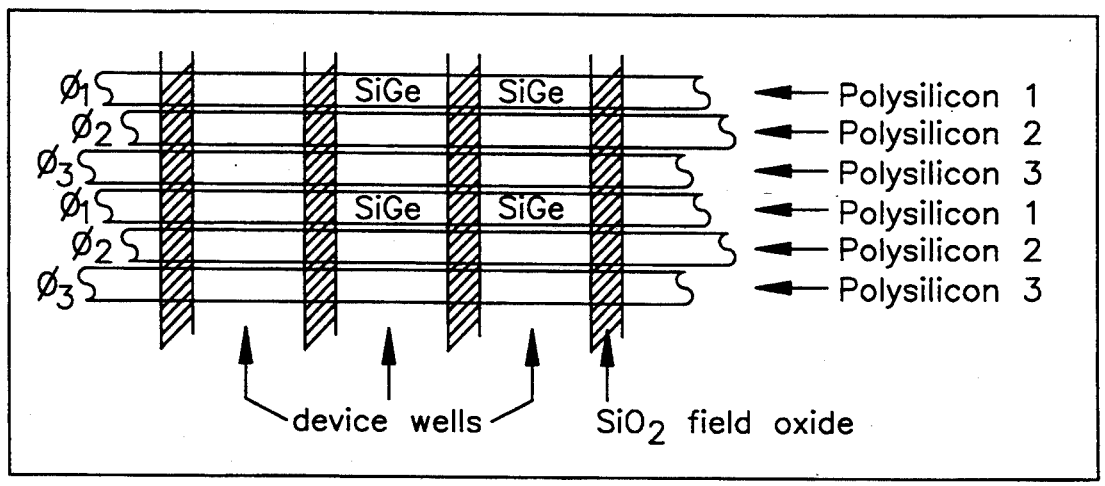
FIG. 16 shows a frame transfer area array using SiGe photogates.

A positive d.c. bias is supplied to the polysilicon gate which forms a depletion region at the surface of the silicon. This is a high field region with a potential maximum at the surface. This surface depletion region can act a collection and storage region of the photogenerated electrons. When this gate is illuminated visible and infra-red radiation the polysilicon is transparent while the silicon region absorbs visible light and creates electron-hole papers. Infrared radiation will be absorbed by the SiGe region and also create electron hole pairs. The electrons will be collected by the high field region of the depletion layer and collected and stored at the surface. At the end of the integration time this photogenerated signal charge can be transferred to a normal silicon CCD shift register. The architecture which is a well accepted technique (see "CCD Image Sensors" [5]) is shown in FIG. 15. The SiGe photogate can also be used to realize frame-transfer organization and TDI area arrays (see Chamberlain and Washkurak [6]). This arrangement is shown in FIG. 16. Shift registers are used to form linear and area image sensor arrays employing conventional architectures (see Chamberlain and Broughton [7]).

FIG. 14 shows an array of SiGe photogates collecting visible and new infra-red radiation and storing this under the SiGe photogate. At the end of the integration time, this signal charge is transferred into the read out shift-register. This arrangement realizes a linear image sensor array which is capable of detecting visible and infra-red radiation of wavelengths in the region of 0.4 $\mu$m to 1.7 $\mu$m. The cross-section of one pixel is shown in FIG. 15. Both the SiGe photogate and the CCD read out shift register is integrated on the same silicon wafer or silicon die.

FIG. 16 shows the employment of a SiGe photogate to realize area arrays. Interline area arrays can also be realized using these techniques.

Figure 17:
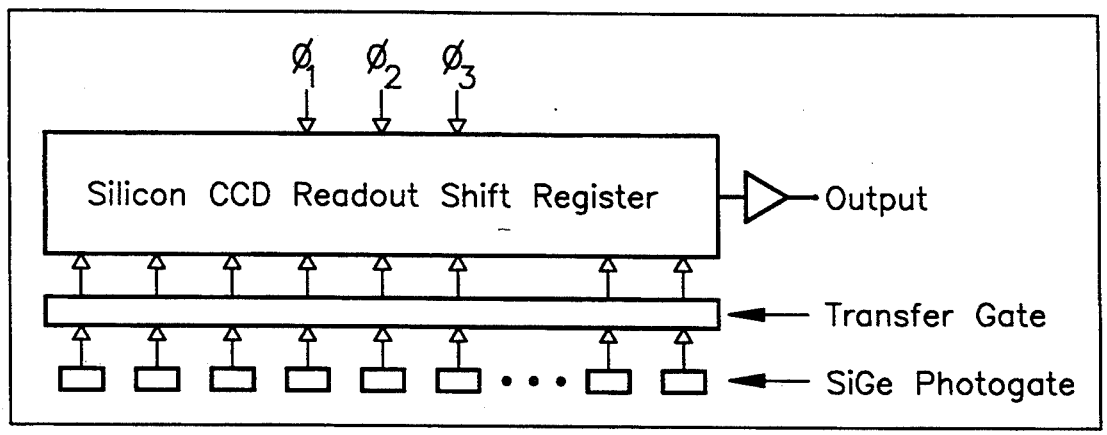
FIG. 17 shows an interline architecture utilizing a SiGe diode region acting as a photodetector.

FIG. 17 shows an interline architecture utilizing a SiGe photodiode region acting as a photodetector. The same interline architecture using SiGe photodiodes can also be used to form area image sensor arrays.

What is claimed as the invention is:

1. A method of fabricating a silicon-germanium device on a silicon or polycrystalline silicon substrate, comprising at least one step of implanting said substrate with Ge+, to realize active binary Group IV SiGe alloy regions within Si which are substantially free from defects, during fabrication of the device, wherein the maximum germanium concentration in the said active regions is less than 50%.

2. A method as recited in claim 1, comprising at least one cycle of the steps of:
    a. creating a masking layer over a desired region of said substrate;
    b. using a lithographic technique to etch at least one window through said masking layer to reach said substrate; and
    c. implanting germanium ions into said substrate through said window.

3. A method as recited in claim 2, comprising two or more cycles of said steps of claim 2, where said windows in said separate cycles are at different locations from each other, whereby areas of different germanium concentration may be achieved.

4. A method as recited in claim 3, where at least some portions of some of said windows in said separate cycles overlap, whereby at least some areas of said substrate are exposed to several germanium implantation steps, whereby greater variations in germanium concentration may be achieved.

5. A method as recited in claim 1, wherein said device is a Metal-Insulator-Semiconductor in which said active SiGe region forms the device channel.

6. A method as recited in claim 5, wherein said device is a MOSFET having an SiGe channel.

7. A method as recited in claim 1, wherein said device is a photogate which is substantially free from defects and able to detect both visible and infra red radiation.

8. A method as recited in claim 1, wherein said devices are substantially defect-free SiGe MOSFET gates which are used as photodetectors for visible and infra-red radiation with silicon CCD shift registers to form linear and area image sensors, all integrated on the same silicon die.

9. A method as recited in claim 1, wherein said devices are substantially defect-free SiGe photodiodes which are integrated on the same silicon die to form linear and area image sensor arrays which can operate and detect light in the visible and infra-red wavelength range.

10. A method as recited in claim 6, wherein said SiGe channels are square.

11. A method as recited in claim 10, wherein said channels are no greater than 8 microns in width by 8 microns in length.

* * * * *